US012593591B2

(12) United States Patent
Leng

(10) Patent No.: US 12,593,591 B2
(45) Date of Patent: Mar. 31, 2026

(54) DISPLAY PANEL AND DISPLAY DEVICE

(71) Applicant: Shanghai Tianma Micro-Electronics Co., Ltd., Shanghai (CN)

(72) Inventor: Chuanli Leng, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 751 days.

(21) Appl. No.: 17/815,574

(22) Filed: Jul. 28, 2022

(65) Prior Publication Data

US 2022/0367589 A1    Nov. 17, 2022

(30) Foreign Application Priority Data

May 31, 2022    (CN) .......................... 202210607354.7

(51) Int. Cl.
*H10K 59/38*          (2023.01)
*H10K 59/12*          (2023.01)
*H10K 59/126*         (2023.01)
*H10K 59/65*          (2023.01)
*H10K 59/80*          (2023.01)

(52) U.S. Cl.
CPC ............. *H10K 59/38* (2023.02); *H10K 59/12* (2023.02); *H10K 59/126* (2023.02); *H10K 59/8791* (2023.02); *H10K 59/65* (2023.02)

(58) Field of Classification Search
CPC .. H10K 59/1213; H10K 59/122; H10K 59/38; H10K 50/813; H10K 50/86; H10K 50/865; H10K 59/353; H10K 59/40; H10K 59/65; H10K 59/80515; H10K 59/8723; H10K 59/8791; H10K 59/8792; H10K 59/88; H10K 59/121; H10K 59/126; H10K 59/131; H10D 86/441; H10D 86/60; H01L 21/4853; H01L 21/4857; H01L 2224/02331
See application file for complete search history.

(56) References Cited

U.S. PATENT DOCUMENTS

2020/0293739 A1*   9/2020   Yang ..................... H10K 59/131
2022/0384544 A1*  12/2022   An ......................... H10K 59/122
2023/0006007 A1*   1/2023   Jo .......................... H10K 59/122

FOREIGN PATENT DOCUMENTS

CN          109244104 A       1/2019
CN          111739915 A      10/2020

* cited by examiner

*Primary Examiner* — Jessica S Manno
*Assistant Examiner* — Victor Joseph Lasasso
(74) *Attorney, Agent, or Firm* — KILPATRICK TOWNSEND & STOCKTON LLP

(57) ABSTRACT

A display panel and a display device are disclosed. A display area of the display panel includes a first sub-display area, a second sub-display area and a third sub-display area. The display panel includes a substrate; multiple sub-pixels, a light-shielding layer, and color film units. The multiple sub-pixels are in the display area. The light-shielding layer includes a light-shielding structure and first openings. Each color film unit is located in a corresponding first opening, and at least a part of the color film unit covers the light-shielding structure. A part of the light-shielding structure covered with the color film unit in the second sub-display area is smaller than a part of the light-shielding structure covered with the color film unit in the third sub-display area. And/or, the color film unit in the second sub-display area is thinner than the color film unit in the third sub-display area.

20 Claims, 9 Drawing Sheets

DISPLAY PANEL AND DISPLAY DEVICE

CROSS REFERENCE OF RELATED APPLICATION

The present disclosure claims priority to Chinese Patent Application No. 202210607354.7, titled "DISPLAY PANEL AND DISPLAY DEVICE", filed on May 31, 2022 with the China National Intellectual Property Administration, which is incorporated herein by reference in its entirety.

FIELD

The present disclosure relates to the field of electronic device, and particularly to a display panel and a display device.

BACKGROUND

With the continuous development of science and technology, more and more display devices are widely used in people's daily life and work, and bring great convenience to people's daily life and work, which make them indispensable to the people.

A display panel is a main component in the display device for realizing the image display. A sensing element for sensing light, such as a camera, is required to integrate into the display device in order to meet the photosensitive performance of the display device. The display panel is generally designed with an under-screen camera, that is to say, the camera is arranged on a rear surface of the display panel, in order to increase a screen-to-body ratio.

In a case that the camera is arranged on the rear surface of the display panel, sub-pixels arranged in a local area of the display panel need to be adjusted in order to improve incidence of light onto the camera through the display panel. As a result, a reflectivity of the local area is different from that of areas that are not adjusted, resulting in a vision disparity in the display panel in a black-screen state.

SUMMARY

In view of this, a display panel and a display device are provided in the present disclosure, which are described as follows.

A display panel is provided. A display area of the display panel includes a first sub-display area, a second sub-display area surrounding at least a part of the first sub-display area, and a third sub-display area surrounding at least a part of the second sub-display area. A side of the first sub-display area away from a display surface is configured to carry a sensing element for sensing light.

A display panel includes: a substrate; multiple sub-pixels, a light-shielding layer, and color film units.

The multiple sub-pixels are arranged in the display area on a side of the substrate.

The light-shielding layer is arranged on a side of the sub-pixel away from the substrate and includes a light-shielding structure and first openings, where the first openings are in one-to-one correspondence with the sub-pixels.

The color film units are arranged corresponding to the first openings. Each color film unit is located at a corresponding one of the first openings. At least a part of the color film unit is arranged to cover the light-shielding structure.

Within a unit area, an area of part of the light-shielding structure covered with the color film unit in the second sub-display area is a first area, and an area of part of the light-shielding structure covered with the color film unit in the third sub-display area is a second area, and the first area is smaller than the second area.

And/or, a thickness of the color film unit in the second sub-display area is smaller than a thickness of the color film unit in the third sub-display area.

A display device is also provided according to the present disclosure. The display device includes: a display panel and a sensing element for sensing light. A display area of the display panel comprises a first sub-display area, a second sub-display area surrounding at least a part of the first sub-display area, and a third sub-display area surrounding at least a part of the second sub-display area. The display panel includes a substrate; sub-pixels, arranged in the display area on a side of the substrate; a light-shielding layer arranged on a side of the sub-pixels away from the substrate, and the light-shielding layer includes a light-shielding structure and first openings, and the first openings are in one-to-one correspondence with the sub-pixels; and color film units, arranged corresponding to the first openings, where each color film unit is located at a corresponding one of the first openings, and at least a part of the color film unit is arranged to cover the light-shielding structure. Within a unit area, an area of part of the light-shielding structure covered with the color film units in the second sub-display area is a first area, and an area of part of the light-shielding structure covered with the color film units in the third sub-display area is a second area, and the first area is smaller than the second area; and/or, a thickness of the color film units in the second sub-display area is smaller than a thickness of the color film units in the third sub-display area. The sensing element is arranged on a side of the display panel away from a display surface and opposite to the first sub-display area of the display panel.

BRIEF DESCRIPTION OF THE DRAWINGS

To illustrate the embodiments of the present disclosure more clearly, the accompanying drawings used for describing the embodiments are briefly introduced hereinafter. The accompanying drawings in the following description merely show embodiments of the present disclosure, and other drawings may be obtained based on the drawings provided.

The structure, proportion, and size shown in the drawings of the present specification are only used to illustrate the contents disclosed in the specification to understand and read, and are not meant to limit the implementation of the disclosure. Any structural modification, change of proportional relationship, or adjustment of size, that does not affect the efficacy and purpose of the present disclosure, should fall within the scope of the present disclosure.

3

Figure 9:
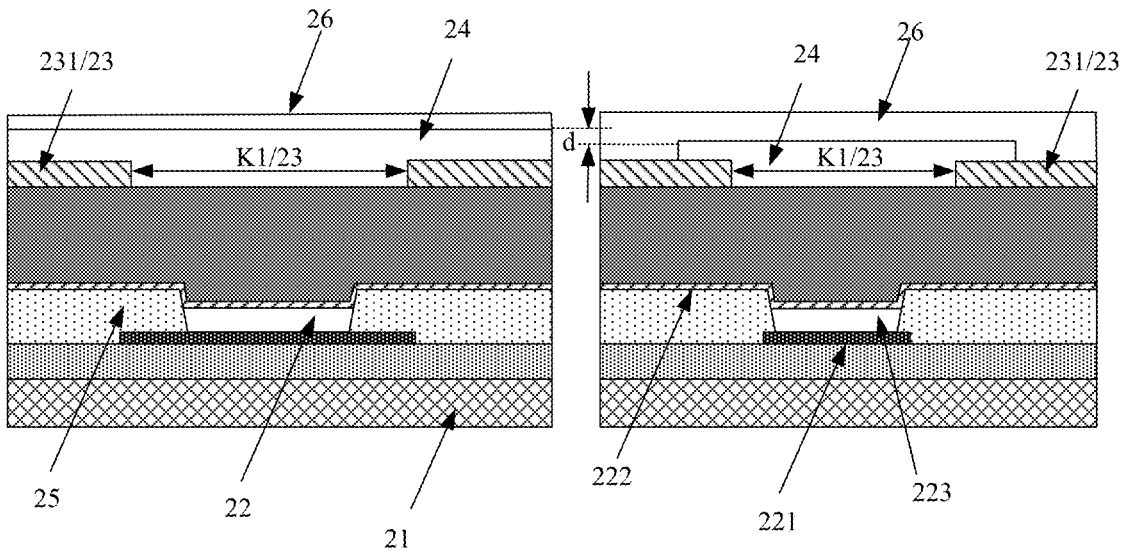
Figure 10:
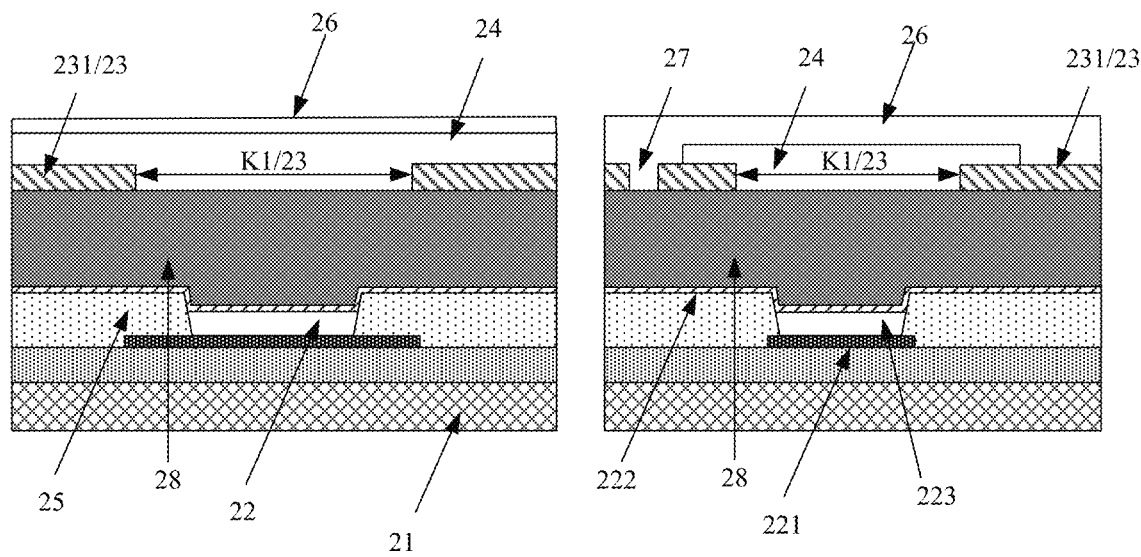
Figure 11:
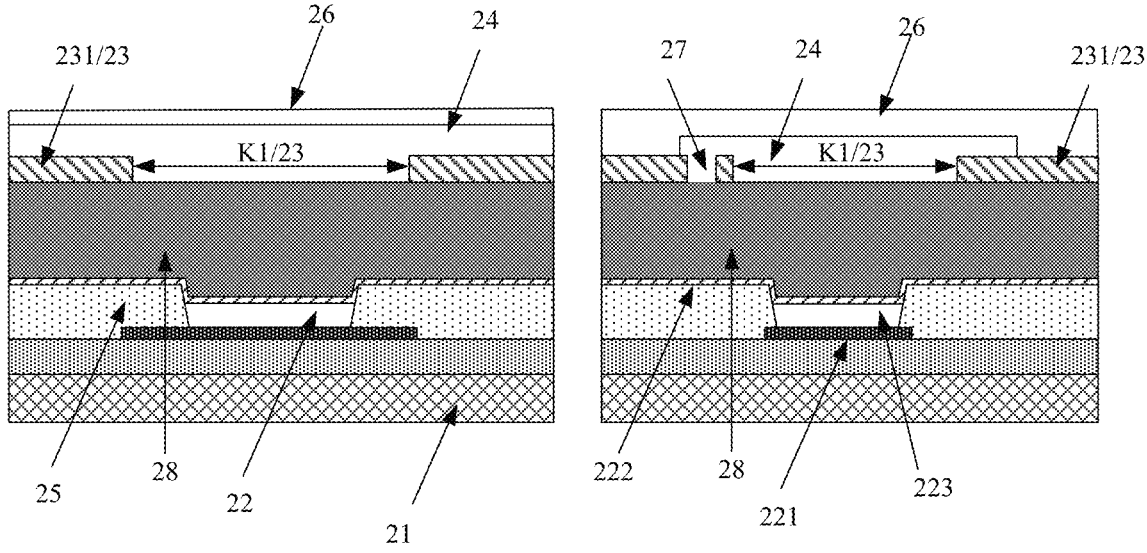
Figure 12:
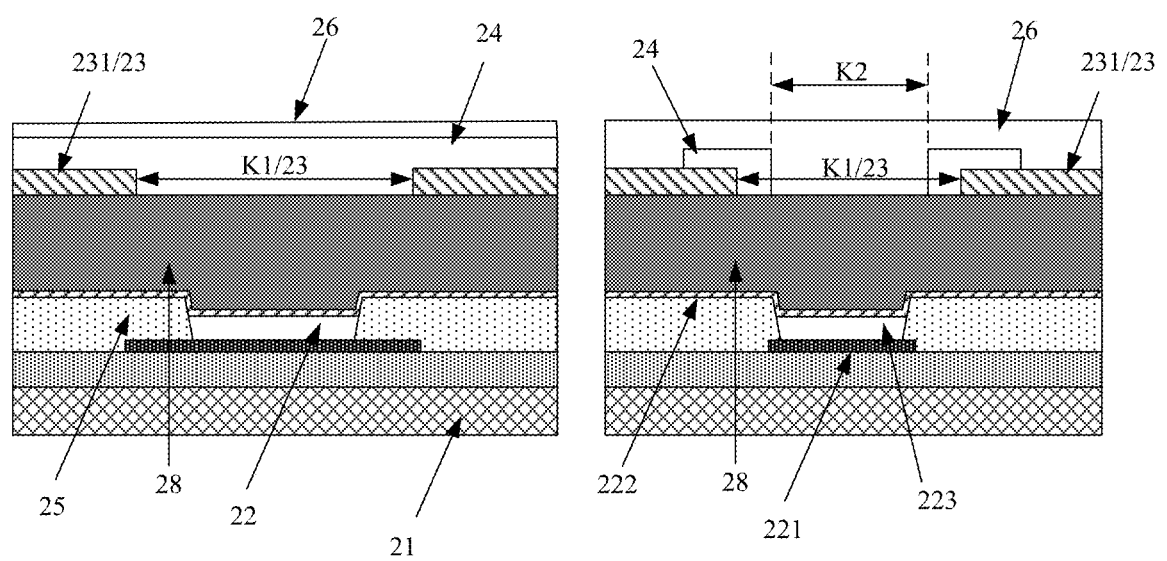
Figure 13:
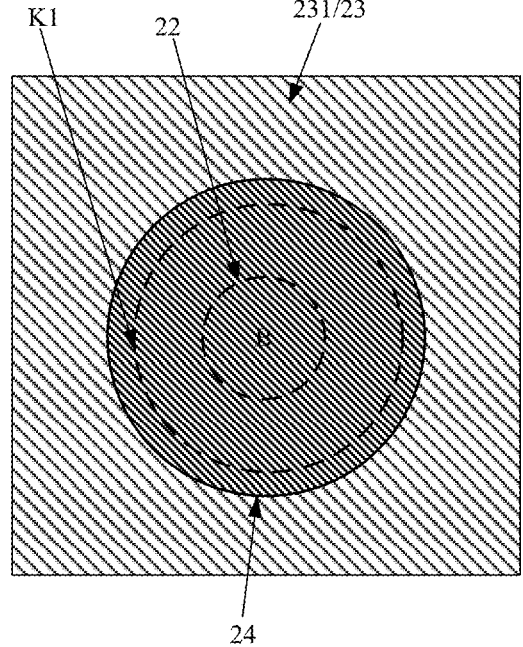
Figure 14:
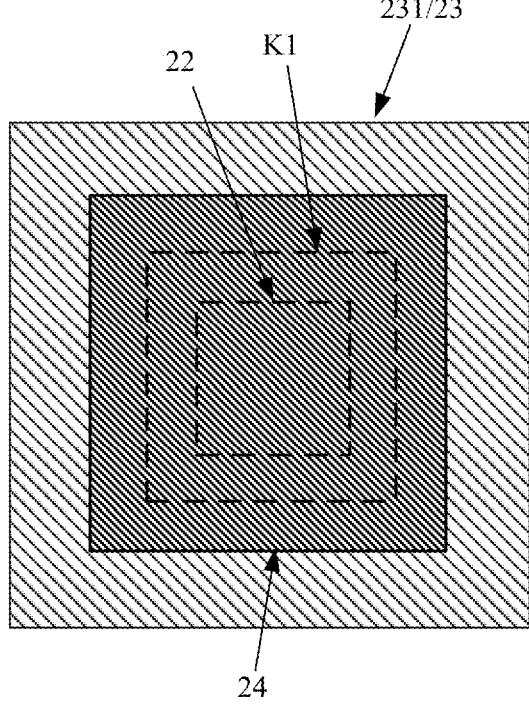
Figure 15:
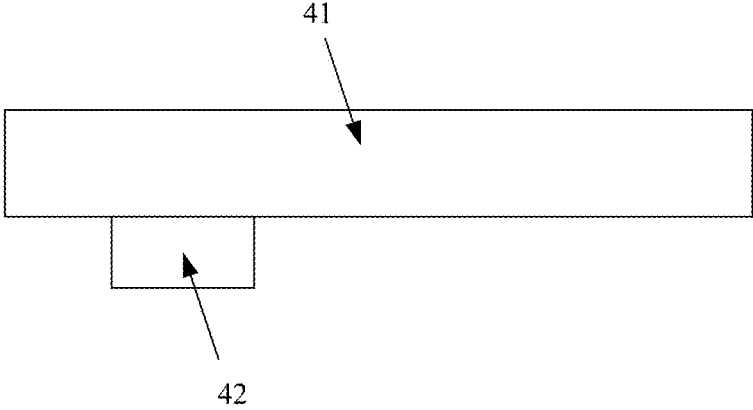

FIG. 9 is a cross-sectional view of a display panel according to an embodiment of the present disclosure;

FIG. 10 is a cross-sectional view of a display panel according to an embodiment of the present disclosure;

FIG. 11 is a cross-sectional view of a display panel according to another embodiment of the present disclosure;

FIG. 12 is a cross-sectional view of a display panel according to still another embodiment of the present disclosure;

FIG. 13 is a top view of a sub-pixel and a first opening and a color film unit corresponding to the sub-pixel in the second sub-display area;

FIG. 14 is another top view of the sub-pixel and the first opening and the color film unit corresponding to the sub-pixel in the second sub-display area; and FIG. 15 is a structural view of a display device according to an embodiment of the present disclosure.

DETAILED DESCRIPTION OF THE EMBODIMENTS

The embodiments of the present disclosure are described clearly and completely in conjunction with the drawings in the embodiments of the present disclosure hereinafter. It is apparent that the described embodiments are only a few rather than all of the embodiments according to the present disclosure.

Figure 1:
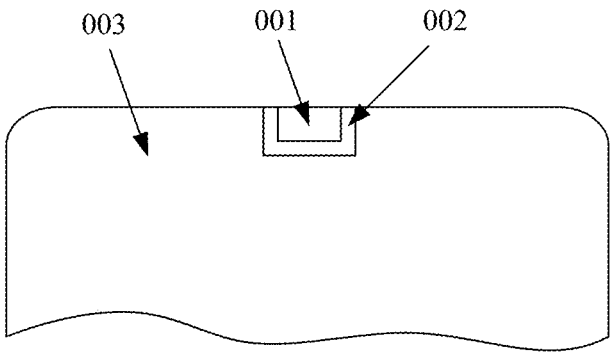
FIG. 1 is a top view of a display panel.
Figure 2:
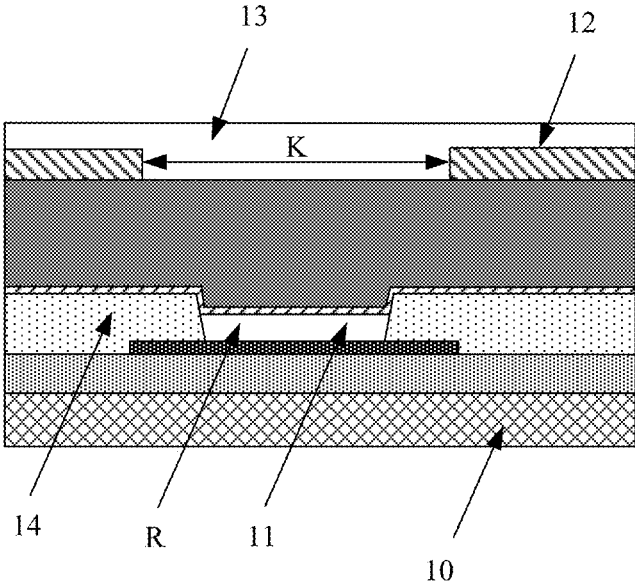
FIG. 2 is a cross-sectional view of the display panel shown in FIG. 1.

Referring to FIGS. 1 and 2, FIG. 1 is a top view of a display panel, and FIG. 2 is a cross-sectional view of the display panel shown in FIG. 1. The display panel includes a substrate 10, a sub-pixel 11 for image display, a light-shielding layer 12. The sub-pixel 11 is arranged on a side of the substrate 10. The light-shielding layer 12 is arranged on a light-emitting side of the sub-pixel 11. An opening K is arranged on the light-shielding layer 12 at a region corresponding to the sub-pixel 11. The sub-pixel 11 is exposed through the opening K, so as to facilitate emitting light and displaying the image. A color film unit 12 is arranged at the opening K for filling the opening K and covering a surface of the light shielding layer 12 away from the sub-pixel 11. A pixel definition layer 14 is arranged on the substrate 10. The pixel definition layer 14 is provided with a pixel opening, in which the sub-pixel 11 is arranged.

As shown in FIG. 1, a display area of the display panel includes a first sub-display area 001, a second sub-display area 002 surrounding at least a part of the first sub-display area 001, and a third sub-display area 003 surrounding at least a part of the second sub-display area 002. The embodiment shown in FIG. 1 is illustrated taken a side of the first sub-display area 001 and a side of the third sub-display area 003 being arranged on the same line as an example. In this case, a part of the first sub-display area 001 is surrounded by the second sub-display area 002, and a part of the second sub-display area 002 is surrounded by the third sub-display area 003. In another embodiment, the first sub-display area 001 may be arranged inside the third sub-display area 003. In this case, the entire first sub-display area 001 is surrounded by the second sub-display area 002, and the entire second sub-display area 002 is surrounded by the third sub-display area 003.

The first sub-display area 001 serves as an area for disposing a sensing element. A sensing element for sensing light, such as an under-screen camera, is arranged below the first sub-display area 001. The third sub-display area 003 is a normal display area in which a size of the sub-pixel 11 is not changed. The first sub-display area 001 includes a light-transmitting area and a display area. In order to allow the first sub-display area 001 to meet the high photosensitive requirement of the under-screen camera and the like, the first sub-display area 001 is generally arranged in two ways. In a first way, the first sub-display area 001 has reduced size of the pixel opening and unchanged density of pixels. In a second way, the first sub-display area 001 has reduced density of pixels. The purpose is to reserve a space for forming the light-transmitting area in the first sub-display area 001 to allow more light to pass through the first sub-display area 001 and reach the sensing element for sensing light arranged below the first sub-display area 001. The light-transmitting area refers to an area with a high light transmittance in which a material that affects the transmittance, such as metal, is not contained in the panel. The second sub-display area 002 is arranged between the first sub-display area 001 and the third sub-display area 003 in order to further improve the transmittance of the first sub-display area 001. A TFT pixel circuit is arranged in the second sub-display area 002. The circuit of the second sub-display area 002 is electrically connected to the pixels in the first sub-display area 001 through transparent wires such as ITO, so as to realize the display function of the first sub-display area 001. The transmittance of the first sub-display area 001 is further improved because fewer pixel circuit and/or no pixel circuit is arranged in the first sub-display area 001. In addition, in a case that the density of the pixels in the third sub-display area 003 is greater than that in the first sub-display area 001, the second sub-display area 002 is arranged to have a gradually changed density of pixels and a sudden change in the density of pixels from the third sub-display area 003 to the first sub-display area 001 is avoided, and a graininess caused by a difference in the density of pixels between these two areas is reduced.

Based on the above description, it can be seen that the third sub-display area 003 is a normal display area, the second sub-display area 002 is a transition area between the first sub-display area 001 and the third sub-display area 003. The second sub-display area 002 and the third sub-display area 003 are areas with a low transmittance of ambient light, while the first sub-display area 001 is an area with a high transmittance of ambient light, and more ambient light is incident onto the camera, so as to ensure the imaging quality of the camera.

A size of the sub-pixel in the second sub-display area 002 is smaller than a size of the sub-pixel in the third sub-display area 003. Accordingly, an anode in the third sub-display area 003 is large and has a high reflectivity to ambient light, while the anode in the second sub-display area 002 is small and has a low reflectivity to ambient light. In this way, in a black-screen state, the reflectivity of the second sub-display area 002 to ambient light is reduced as compared with the third sub-display area 003, and thus a visual difference occurs between the second sub-display area 002 and the third sub-display area 003.

In view of the above problems, a display panel and a display device are provided in the embodiments of the present disclosure. Within a unit area, a larger area of light-shielding structure is arranged to expose through the color film unit in the second sub-display area as compared with that in the third sub-display area. Since the reflectivity of the light-shielding structure is higher than that of the light-shielding structure covered with the color film unit, the reflectivity of the second sub-display area to ambient light may be increased. As a result, the problem that the reflectivity of the second sub-display area is reduced due to the sensing element being arranged below the first sub-display area is solved. When the display panel is in a black-screen state, the reflectivity of the second sub-display area and the reflectivity of the third sub-display area to ambient light meet the same condition, so as to achieve the same visual effect of appearance for both the second sub-display area and the third sub-display area.

And or, the thickness of the color film unit in the second sub-display area is arranged to be smaller than the thickness of the color film unit in the third sub-display area. The light-shielding structure covered with the color film unit having the smaller thickness in the second sub-display area has a higher reflectivity to ambient light as compared with the light-shielding structure covered with the color film unit having the larger thickness in the third sub-display area. Therefore, the reflectivity of the second sub-display area and the reflectivity of the third sub-display area to ambient light meet the same condition, so as to achieve the same visual effect of appearance for both the second sub-display area and the third sub-display area.

In order to make the embodiments of the present disclosure more understandable, the present disclosure is further described in detail below in conjunction with the accompanying drawings and detailed description.

Figure 3:
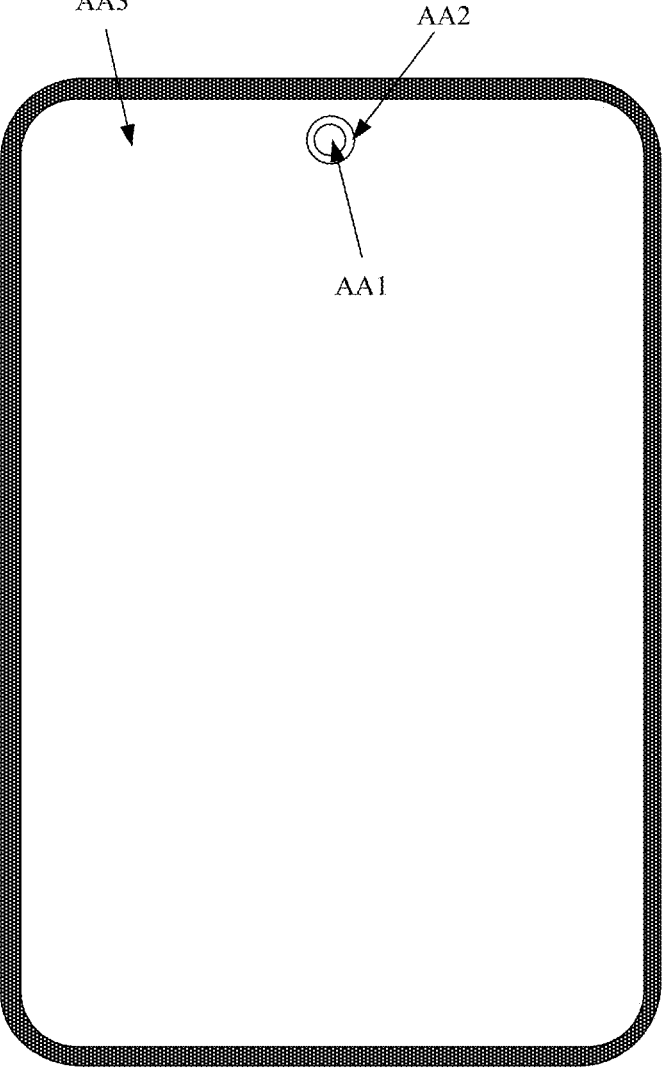
FIG. 3 is a top view of a display panel according to the present disclosure.
Figure 4:
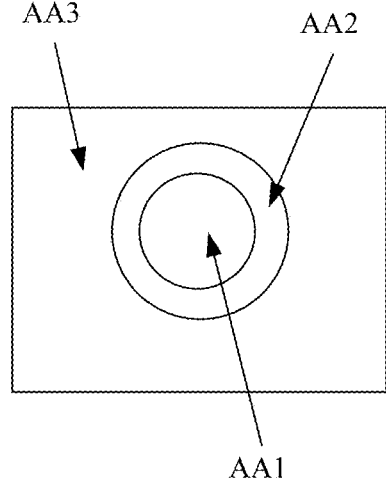
FIG. 4 is a partially enlarged view of the display panel shown in FIG. 3.
Figure 5:
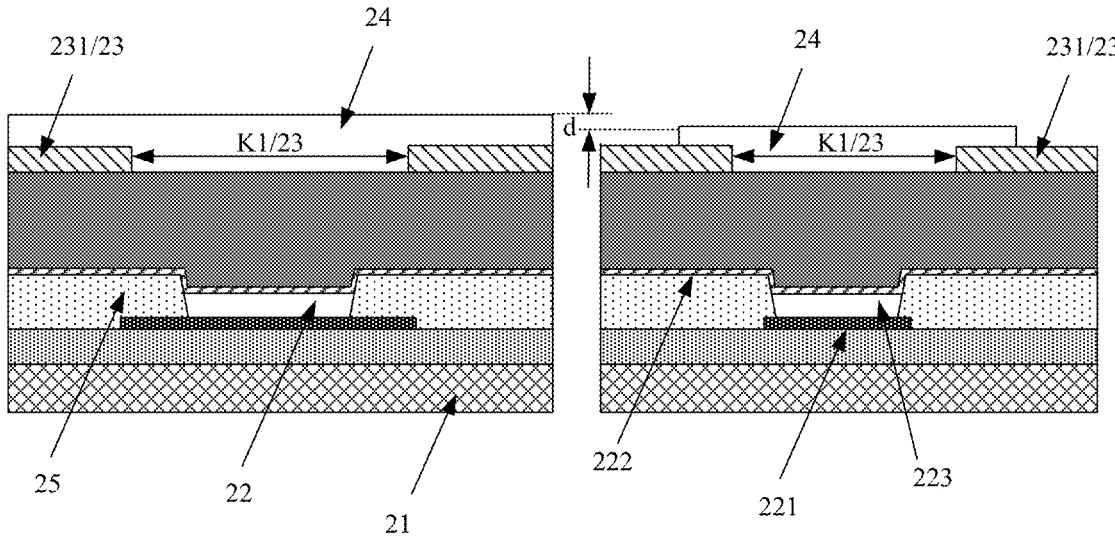
FIG. 5 is a cross-sectional view of the display panel shown in FIG. 3.

Referring to FIGS. 3 to 5, FIG. 3 is a top view of a display panel according to the present disclosure, FIG. 4 is a partial enlarged view of the display panel shown in FIG. 3, and FIG. 5 is a cross-sectional view of the display panel shown in FIG. 3. In FIG. 5, the left portion of FIG. 5 is a cross-sectional view of a third sub-display area AA3 of the display panel, and the right portion of FIG. 5 is a cross-sectional view of a second sub-display area AA2 of the display panel. It should be noted that multiple sub-pixels 22 are arranged in each of the three sub-display areas. In the embodiment shown in FIG. 5, in order to clearly illustrate a sectional structure of the display panel, a structure in which only one sub-pixel 22 is arranged in each of the second sub-display area AA2 and the third sub-display area AA3 is shown.

In the embodiment of the present disclosure, the display area of the display panel includes a first sub-display area AA1, a second sub-display area AA2 surrounding at least a part of the first sub-display area AA1, and a third sub-display area AA3 surrounding at least a part of the second sub-display area AA2. A side of the first sub-display area AA1 away from a display surface is configured to carry a sensing element for sensing light. The sensing element may be an under-screen camera. The sensing element is not limited to a camera, and may be other optical sensors, such as an optical sensor for measuring a distance.

The display panel includes a substrate 21, multiple sub-pixels 22, a light-shielding layer 23, and color film units 24. The substrate 21 is an array substrate. The sub-pixels 22 are arranged in the display area on a side of the substrate 21. The light-shielding layer 23 is arranged on a side of the sub-pixel 22 away from the substrate 21. The light-shielding layer 23 includes a light-shielding structure 231 and first openings K1, where one first opening K1 corresponds to one sub-pixel 22. One color film unit 24 corresponds to one first opening K1, and is arranged in the corresponding first opening K1, with at least part of the color film unit 24 being arranged to cover the light shielding structure 231.

As described above, in a design, the second sub-display area AA2 has a lower reflectivity to ambient light than the third sub-display area AA3 in the black-screen state, and thus a visual difference occurs between the second sub-display area AA2 and the third sub-display area AA3. In order to solve this problem, the following three implementations may be implemented in the embodiments of the present disclosure.

In a first implementation, within a unit area, an area of the part of the light-shielding structure 231 covered by the color film unit 24 in the second sub-display area AA2, which is referred to as a first area, is smaller than an area of the part of the light-shielding structure 231 covered by the color film unit in the third sub-display area AA3, which is referred to as a second area.

The unit area may be set to be 1 cm×1 cm, or 2 cm×2 cm, 0.5 cm×0.5 cm or the like as needed, which is not limited in the embodiment of the present disclosure. In the second sub-display area AA2 and the third sub-display area AA3, multiple sub-pixels 22 are arranged within a unit area.

In the first implementation, the first area is arranged to be smaller than the second area, and a proportion of the light-shielding structure 231 covered with the color film unit 24 in the second sub-display area AA2 is smaller than a proportion of the light-shielding structure 231 covered with the color film unit 24 in the third sub-display area AA3. In this way, within a unit area, a larger area of the light-shielding structure 231 is exposed through the color film unit 24 in the second sub-display area AA2 as compared with that in the third sub-display area AA3. Since the reflectivity of the light-shielding structure 231 is higher than that of the light-shielding structure 231 covered with the color film unit 24, the reflectivity of the second sub-display area AA2 to ambient light may be increased. As a result, the problem that the second sub-display area AA2 has a lower reflectivity to ambient light than the third sub-display area AA3 is solved. When the display panel is in a black-screen state, the reflectivity of the second sub-display area AA2 and the reflectivity of the third sub-display area AA3 to ambient light meet the same condition, so as to achieve the same visual effect of appearance for both the second sub-display area AA2 and the third sub-display area AA3.

In a second implementation, the thickness of the color film unit 24 in the second sub-display area AA2 is smaller than the thickness of the color film unit 24 in the third sub-display area AA3.

In one embodiment, the color film unit 24 in the second sub-display area AA2 has a first thickness, and the color film unit 24 in the third sub-display area AA3 has a second thickness. The first thickness is smaller than the second thickness, and a difference between the first thickness and the second thickness is d. The light-shielding structure 231 covered with the color film unit 24 having a larger thickness has a lower reflectivity to ambient light, while the light-shielding structure 231 covered with the color film unit 24 having a smaller thickness has a higher reflectivity to ambient light. Therefore, in the second implementation, the reflectivity of the second sub-display area AA2 to ambient light may be increased, and the reflectivity of the second sub-display area AA2 and the reflectivity of the third sub-display area AA3 to ambient light meet the same condition, so as to achieve the same visual effect of appearance for both the second sub-display area AA2 and the third sub-display area AA3. A value of d may be set based on requirements, which is not limited in the embodiment of the present disclosure.

In a third implementation, within a unit area, the area of the part of the light-shielding structure 231 covered with the color film unit 24 in the second sub-display area AA2, which is referred to as the first area, is smaller than the area of the part of the light-shielding structure 231 covered with the color film unit 24 in the third sub-display area AA3, which is referred to as the second area. In addition, the thickness of the color film unit 24 in the second sub-display area AA2 is smaller than the thickness of the color film unit 24 in the third sub-display area AA3.

With the above three implementations, the reflectivity of the second sub-display area AA2 and the reflectivity of the third sub-display area AA3 to ambient light meet the same condition in the black-screen state. In this way, within a unit area, a reflective luminance of the second sub-display area AA2 and a reflective luminance of the third sub-display area AA3 to ambient light meet the same condition. As a result, the difference in appearance occurring between the second sub-display area AA2 and the third sub-display area AA3 due to the low reflective luminance of the second sub-display area AA2 to ambient light is avoided. It should be noted that, the same condition refer to the same or similar condition in the embodiments of the present disclosure.

In the embodiment of the present disclosure, any one of the above three implementations may be used, and it is not limited to the third implementation shown in FIG. 5. In the embodiment of the present disclosure, an example in which the second sub-display area AA2 is arranged to surround entire first sub-display area AA1 and the third sub-display area AA3 is arranged to surround entire second sub-display area AA2 is described. In on embodiment, in a case that the first sub-display area AA1 is close to a frame area of the display panel, the second sub-display area AA2 may be arranged to surround a part of the first sub-display area AA1, and the third sub-display area AA3 may be arranged to surround a part of the second sub-display area AA2.

As shown in FIG. 4, in the display panel, the first sub-display area AA1 is arranged to be in a circular shape. Corresponding to the first sub-display area AA1 in a circular shape, the second sub-display area AA2 is arranged to be in an annular shape surrounding the first sub-display area AA1. In another implementation, the first sub-display area AA1 may also be arranged to be in a rectangle shape. Corresponding to the first sub-display area AA1 in a rectangle shape, the second sub-display area AA2 may be arranged to be in a shape of a rectangular box surrounding the first sub-display area AA1.

In one embodiment, the substrate 21 may be a glass substrate or another insulating substrate. A pixel circuit is arranged on the substrate 21. The pixel circuit is configured to drive the sub-pixels 22 to emit light and display an image. The pixel circuit includes thin film transistors TFTs. The pixel circuit and the thin film transistors TFTs are not shown in FIG. 5. The sub-pixels 22 are arranged on a side of the thin film transistors away from the substrate 21.

In the embodiment of the present disclosure, the display panel is an OLED panel, and the sub-pixel is an OLED light-emitting element. The OLED light-emitting element includes an organic light-emitting layer 223. An anode 221 is arranged on the substrate 21, and a pixel definition layer 25 is arranged on a side of the anode 221 away from the substrate 21. The pixel definition layer 25 is provided with a pixel opening in which the organic light-emitting layer 223 of the sub-pixel 22 is located. A common cathode 222 is covered on a side of the pixel definition layer 25 away from the substrate 21. The shape and size of the sub-pixel 22 may be adjusted by setting the shape and size of the pixel opening in the pixel definition layer 25.

In the display panel, the density of the sub-pixels 22 in the second sub-display area AA2 is arranged to be the same as the density of the sub-pixels 22 in the third sub-display area AA3. The density of the sub-pixels in the second sub-display area is not changed relative to that of the third sub-display area AA3, and this facilities process preparation. For sub-pixels emitting light of same color, the sub-pixel 22 in the second sub-display area AA2 is smaller than the sub-pixel 22 in the third sub-display area AA3, so as to increase the transparency of the second sub-display area AA2 to ambient light and to facilitate the sensing element to sense the ambient light. The area of the light-shielding structure 231 in the second sub-display area AA2 is larger than the area of the light-shielding structure 231 in the third sub-display area AA3 per unit area.

Given the constant area of the second sub-display area AA2, since the density of the sub-pixels in the second sub-display area AA2 is the same as the density of the sub-pixels in the third sub-display area AA3 and the size of the sub-pixel 22 in the second sub-display area AA2 is relatively smaller, the area of the light-shielding structure 231 in the second sub-display area AA2 is larger than that in the third sub-display area AA3 within a unit area. In this way, it helps to increase the reflectivity of the second sub-display area AA2 by exposing a larger area of the light-shielding structure 231 through the color film unit 24.

Reference is made to Table 1.

|  | Third sub-display area | Second sub-display area |
| --- | --- | --- |
| Pixel opening | Large | Small |
| First opening | Large | Small |
| Width of a covered portion of the light-shielding structure | Large (for example, the entire light-shielding structure is covered) | Small (for example, a portion of the light-shielding structure in width of 2 μm to 6 μm that extends beyond the first opening is covered) |

The density of the sub-pixels in the second sub-display area AA2 is the same as the density of the sub-pixels in the third sub-display area AA3, and the size of the sub-pixel 22 in the second sub-display area AA2 is relatively small. Since the size of the sub-pixel 22 depends on the size of the pixel opening, the size of the pixel opening in the third sub-display area AA3 is large, and the size of the pixel opening in the second sub-display area AA2 is small, as shown in Table 1.

The size of the pixel opening in the third sub-display area AA3 is large, the size of the pixel opening in the second sub-display area AA2 is small, and the size of the first opening K1 in the light shielding layer 23 is matched with the size of the pixel opening corresponding to the first opening K1. Therefore, as shown in Table 1, the size of the first opening K1 in the third sub-display area AA3 is large, and the size of the first opening K1 in the second sub-display area AA2 is small.

As described above, the sub-pixel has a smaller size in the second sub-display area AA2 as compared with that the third sub-display area AA3, therefore the second sub-display area AA2 has a lower reflectivity than the third sub-display area AA3 within a unit area. The light-shielding structure 231 covered with the color film unit 24 has a lower reflectivity than the light-shielding structure 231 not covered with the color film unit 24. Thus, as shown in Table 1, a proportion of the light-shielding structure 231 covered with the color film unit 24 in the third sub-display area AA3 may be set to be large, so as to reduce the reflectivity of the third sub-display area AA3. A proportion of the light-shielding structure 231 covered with the color film unit 24 in the second sub-display area AA2 may be set to be small, so as to increase the reflectivity of the second sub-display area AA2. Therefore, the reflectivity of the second sub-display area AA2 and the reflectivity of the third sub-display area AA3 meet the same condition, so as to achieve the basically same appearance for both the second sub-display area AA2 and the third sub-display area AA3 when the display panel is in a black-screen state. The occurrence of black circle in the second sub-display area AA2 as a transition area between the first sub-display area AA1 and the third sub-display area AA3 is avoided.

Figure 6:
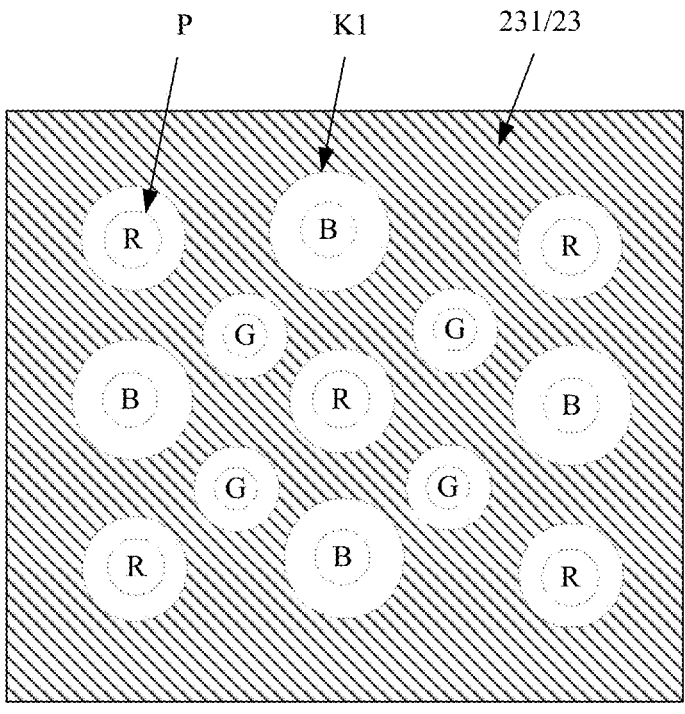
FIG. 6 is a top view of a light-shielding layer and a pixel opening in the display panel according to an embodiment of the present disclosure.

Referring to FIG. 6, FIG. 6 is a top view of a light-shielding layer and a pixel opening of a display panel according to an embodiment of the present disclosure. The display panel includes at least three types of sub-pixels 22 with each type emitting light of a different color. The three types of sub-pixels 22 are red sub-pixels R, green sub-pixels G and blue sub-pixels B. Each of sub-pixels 22 is arranged in a corresponding pixel opening P. As shown in combination with FIG. 5 and FIG. 6, the light shielding layer 23 is arranged on the side of the sub-pixel 22 away from the substrate 21. The light shielding layer 23 is generally a layer of black ink. The light shielding layer 23 includes the first openings K1 each corresponding to one sub-pixel 22, for exposing the pixel opening P in which the corresponding sub-pixel 22 is located. In order to ensure the light emitting efficiency of the sub-pixel 22, a vertical projection of the pixel opening P on the substrate 21 falls within a vertical projection of the first opening K1 on the substrate 21, and the boundaries of the two vertical projections do not overlap. The size of the first opening K1 is larger than that of the pixel opening P.

Figure 7:
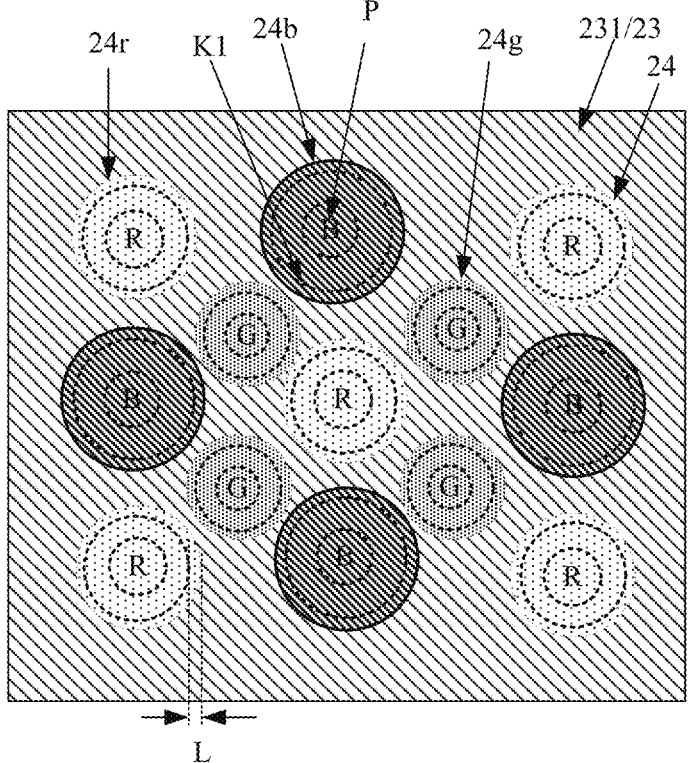
FIG. 7 is a top view of a color film unit in a second sub-display area.

Referring to FIG. 7, FIG. 7 is a top view of the color film unit in the second sub-display area. In the second sub-display area AA2, between two adjacent first openings K1, at least a part of the light shielding structure 231 does not overlap with the color film unit 24 in a direction perpendicular to the display panel. That is to say, at least a part of the light-shielding structure 231 between the two adjacent first openings K1 is not covered with the color film unit 24, and the reflectivity of the second sub-display area AA2 can be increased, and the difference in reflectivity between the second sub-display area AA2 and the third sub-display area AA3 can be reduced, and thus the reflectivity of the second sub-display area AA2 and the reflectivity of the third sub-display area AA3 meet the same condition.

As shown in FIG. 7, in the second sub-display area AA2, a width L of the portion where the color film unit 24 covers the light-shielding structure 231 is 2 μm to 6 μm in a direction parallel to a plane of the light-shielding layer 23. The width L is a distance from an edge of a portion of the color film unit 24 that extends beyond the first opening K1 where the color film unit 24 is located, to the first opening K1. That is to say, in the second sub-display area AA2, the width L of a portion of each of color film units 24 that extends beyond the first opening K where the color film unit 24 is located does not exceed a set threshold, and the width of the portion where the color film unit 24 covers the light-shielding structure 231 does not exceed the set threshold. The set threshold may be set based on requirements, and is not limited to 2 μm to 6 μm. In the case that the width L is set to 2 μm to 6 μm, on one hand the color film unit 24 covers the light-shielding structure 231 with a smaller coverage area in the second sub-display area AA2, so as to increase the reflectivity of the second sub-display area AA2 to ambient light, and increase a luminance of the second sub-display area AA2 in the black-screen state. On the other hand, it facilities the process preparation, and the color film unit 24 fully fills the first opening K1 where the color film unit 24 is arranged and the filtering efficiency is ensured for the sub-pixel 22 below the first opening K1. Each of the first openings K1 corresponds to one color film unit 24, and each of color film units 24 is independent from each other. A gap exists between adjacent color film units 24. The sub-pixels 22 that emit light of different colors correspond to different types of color film units 24. For example, the color film unit 24 corresponding to the red sub-pixel R is a red color film unit 24r, the color film unit 24 corresponding to the green sub-pixel G is a green color film unit 24g, and the color film unit 24 corresponding to the blue sub-pixel B is a blue color film unit 24b.

Figure 8:
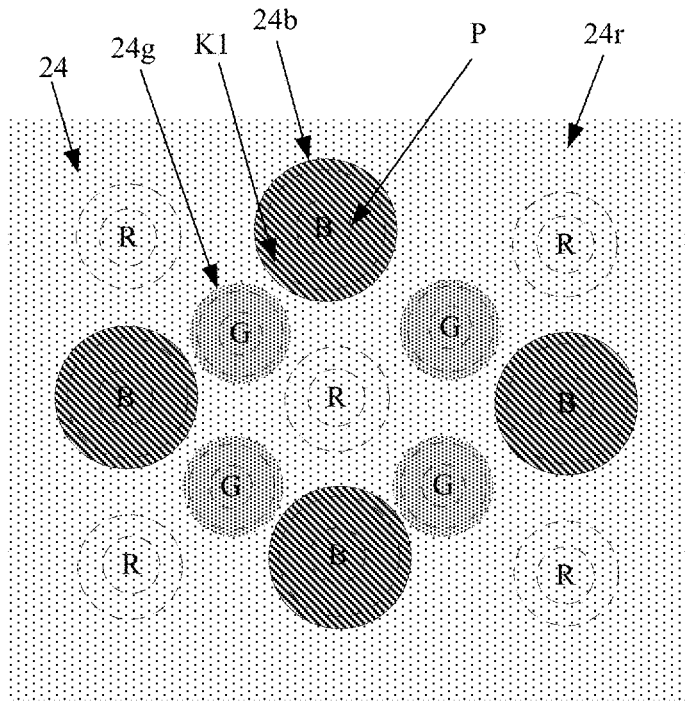
FIG. 8 is a top view of a color film unit in a third sub-display area.

Referring to FIG. 8, FIG. 8 is a top view of the color film unit in the third sub-display area. In the third sub-display area AA3, the color film unit 24 is arranged to entirely cover the light-shielding structure 231 between the two adjacent first openings K1 in a direction perpendicular to the display panel, to reduce the reflectivity of the third sub-display area AA3 to the greatest extent, and the reflectivity of the second sub-display area AA2 and the reflectivity of the third sub-display area AA3 meet the same condition.

For the implementation shown in FIG. 8, in the third sub-display area AA3, the sub-pixels 22 that emit light of different colors are also arranged to correspond to different types of color film units 24. For a green color film unit 24g and a blue color film unit 24b, a portion that extends beyond the first opening K where the color film unit is located has a width that does not exceed a set threshold, and the width of the portion where the color film unit 24 covers the light shielding structure 231 does not exceed a set threshold. The set threshold is in the range of 2 μm to 6 μm. The red color film units 24r for all of the red sub-pixels R form an integrated structure which covers all other areas of the light-shielding structure 231 in the third sub-display area AA3.

In the implementation shown in FIG. 8, in the third sub-display area AA3, the green color film units 24g and the blue color film units 24b are arranged to each only cover the light-shielding structure 231 at the periphery of the first opening K1 where the color film unit is located with a set threshold width. The red color film units 24r for all of the red sub-pixels R form in an integrated structure which covers all other areas of the light-shielding structure 231 in the third sub-display area AA3. In this way, in the third sub-display area AA3, the red color film units 24r cover a large area, while the green color film units 24r and the blue color film units 24b cover a small area. Proportions of light of different wavelength bands reflected in a black-screen state by the third sub-display area AA3 with a larger area is controlled, so as to achieve a better visual effect of appearance in black-screen state.

The color film unit 24, corresponding to a sub-pixel 22 that emits light of a color, allows light of this color to pass through and blocks light of other colors, and the light of this color is reflected by a portion of the light-shielding structure 231 covered by the color film unit 24, and the reflection of light of other colors is reduced. Based on this, proportions of reflected light of various colors in the sub-display area are adjusted by controlling coverages of the color film units 24 corresponding to sub-pixels 22 of various colors in the sub-display area, so as to adjust a chromaticity of appearance of the display panel in a black-screen state, and the chromaticity of the second sub-display area AA2 and the chromaticity of the third sub-display area AA3 of the display panel meet the same condition.

In the embodiment of the present disclosure, the display panel includes a first sub-pixel that emits light of a first primary color. The first sub-pixel may be any one of the red sub-pixel R, the green sub-pixel G and the blue sub-pixel B. The color film unit 24 includes a first color film unit facing the first sub-pixel. In one embodiment, if the first sub-pixel is the red sub-pixel R, the first color film unit is the red color film unit 24r. If the first sub-pixel is the green sub-pixel G, the first color film unit is the green color film unit 24g. If the first sub-pixel is the blue sub-pixel B, the first color film unit is the blue color film unit 24b. Within a unit area, the first color film unit arranged in the second sub-display area AA2 covers the light-shielding structure 231 with a first coverage, and the first color film unit arranged in the third sub-display area AA3 covers the light-shielding structure 231 with a second coverage area. The first coverage area is smaller than the second coverage area.

In the display panel, in order to increase the transmittance to ambient light, the size of the sub-pixels 22 is reduced in the second sub-display area AA2 as compared with that in the third sub-display area AA3. Thus, in the black-screen state, within a unit area, the second sub-display area AA2 reflects ambient light of various primary colors in a proportion different from that of the third sub-display area AA3, and the second sub-display area AA2 has a lower reflective luminance to the ambient light than the third sub-display area AA3, and also the chromaticity of appearance varies from the second sub-display area AA2 to the third sub-display area AA3. As described above, with any one of the first to third implementations, the problem that the reflective luminance to the ambient light varies from the second sub-display area AA2 and to third sub-display area AA3 is solved. Within a unit area, the first coverage area is arranged to be smaller than the second coverage area to reduce the reflection to the light of the first primary color in the ambient light in the second sub-display area AA2, and the proportion of the reflected light of the first primary color in the second sub-display area AA2 and that in the third sub-display area AA3 meet the same condition. As a result, the reflective luminance to the ambient light of the second sub-display area AA and that of the third sub-display area AA3 meet the same condition, and also the chromaticity of the reflected light of the second sub-display area AA and that of the third sub-display area AA3 meet the same condition. Therefore, the luminance and chromaticity of the second sub-display area AA2 and the luminance and chromaticity of the third sub-display area AA3 all meet the same condition in a black-screen state.

Based on the actual chromaticity of the reflected light in the second sub-display area AA2 and the actual chromaticity of the reflected light in the third sub-display area AA3 of the display panel, the first sub-pixel is set to be one of the red sub-pixel R, the green sub-pixel G and the blue sub-pixel B. In the embodiment of the present disclosure, the first sub-pixel is not limited.

In the embodiment of the present disclosure, the display panel includes a first sub-pixel and a second sub-pixel each emitting light of a different color. The color film unit 24 includes a first color film unit facing the first sub-pixel and a second color film unit facing the second sub-pixel. In the second sub-display area AA2, within a unit area, a first difference exists between a coverage of the first color film unit on the light-shielding structure 231 and a coverage of the second color film unit on the light-shielding structure 231. In the third sub-display area AA3, within a unit area, a second difference exists between a coverage of the first color film unit on the light-shielding structure 231 and a coverage of the second color film unit on the light-shielding structure 231. The first difference is not equal to the second difference.

The first sub-pixel emits light of a first primary color, and the second sub-pixel emits light of a second primary color.

Within the unit area, the first difference is set to be different from the second difference, to adjust proportions of reflected light of the first primary color and the second primary color in the second sub-display area AA2 and in the third sub-display area AA3. In the black-screen state, for light of a same primary color, the proportion of reflection in the second sub-display area AA2 meets a condition same as that in the third sub-display area AA3, and the chromaticity of the second sub-display area AA2 and the chromaticity of the third sub-display area AA3 meet the same condition. Based on the actual chromaticity of reflected light in the second sub-display area AA2 and the actual chromaticity of reflected light in the third sub-display area AA3 of the display panel, each of the first sub-pixel and the second sub-pixel is set to be one of the red sub-pixel R, the green sub-pixel G and the blue sub-pixel B. In the embodiment of the present disclosure, the first sub-pixel and the second sub-pixel are not limited.

In the embodiment of the present disclosure, the display panel includes the first sub-pixel and the second sub-pixel each emitting light of a different color. The color film unit 24 includes the first color film unit facing the first sub-pixel and the second color film unit facing the second sub-pixel. In the third sub-display area AA3, within a unit area, a coverage of the first color film unit on the light-shielding structure 231 is larger than a coverage of the second color film unit on the light-shielding structure 231. The first sub-pixel is the sub-pixel 22 that emits red light, that is the red sub-pixel R. The second sub-pixel is any one of the green sub-pixel G and the blue sub-pixel B. In the display panel, the third sub-display area AA3 is the sub-display area occupying the largest area of the display panel. Thus the visual effect of appearance of the display panel in the black-screen state depends mainly on the third sub-display area AA3. As shown in FIG. 8, the red color film unit 24r corresponding to the red sub-pixel R is arranged to cover a larger area of the light-shielding structure 231 to achieve a better visual effect of appearance of the display panel in a black-screen state.

In the embodiment of the present disclosure, the display panel includes the first sub-pixel and the second sub-pixel each emitting light of a different color. The color film unit 24 includes the first color film unit corresponding to the first sub-pixel and the second color film unit corresponding to the second sub-pixel. In the second sub-display area AA2, within a unit area, a coverage of the first color film unit on the light-shielding structure 231 is smaller than a coverage of the second color film unit on the light-shielding structure 231. The second sub-pixel is a sub-pixel that emits green light. The green color film unit 24g has the highest reflectivity among the red color film unit 24r, the green color film unit 24g and the blue color film unit 24b. Thus, the second sub-pixel is arranged to be the sub-pixel that emits green light, that is, the green sub-pixel G, to increase the reflectivity of the second sub-display area AA2 in a black-screen state to the greatest extent and to achieve basically the same visual effect of appearance in a black-screen state for the second sub-display area AA2 and the third sub-display area AA3.

Referring to FIG. 9, FIG. 9 is a cross-sectional view of a display panel according to an embodiment of the present disclosure. In FIG. 9, the left portion of FIG. 9 is a cross-sectional view of the third sub-display area AA3 of the display panel, and the right portion of FIG. 9 is a cross-sectional view of the second sub-display area AA2 of the display panel. As shown in FIG. 9, the display panel further includes a planarization layer 26, which covers the color film unit 24 and the light shielding structure 231. The planarization layer 26 is made of a colorless and transparent material and covers the entire display area of the display panel. That is to say, the planarization layer 26 covers both the second sub-display area AA2 and the third sub-display area AA3. A difference in the reflectivity between the second sub-display area AA2 and the third sub-display area AA3 is not changed in the implementation shown in FIG. 9 as compared with the implementation shown in FIG. 5. Therefore, in the implementation shown in FIG. 9, the reflectivity of the second sub-display area AA2 and the reflectivity of the third sub-display area AA2 may also meet the same condition.

The light-shielding structure 231 with its surface covered directly with the planarization layer 26 has a first reflectivity. The light-shielding structure 231 with its surface sequentially covered with the color film unit 24 and the planarization layer 26 has a second reflectivity. The second reflectivity is less than the first reflectivity. Therefore, with the first implementation described above, the reflectivity of the second display area AA2 may be increased, and the reflectivity of the second sub-display area AA2 and the reflectivity of the third sub-display area AA3 meet the same condition.

Reference is made to Table 2.

| Proportion of the light-shielding structure that is in direct contact and overlaps with the planarization | Second sub-display area | | | Third sub-display area |
|---|---|---|---|---|
| layer | 0% | 20% | 40% | 0% |
| reflectivity | 5.5% | 5.7% | 5.9% | 5.9% |
| a | 0.17 | −0.15 | −1.2 | −0.22 |
| b | 0.28 | 0.12 | 0.11 | 0 |

In Table 2, a and b are color coordinates. It can be seen from Table 2 and FIG. 9 that in the second sub-display area AA2, if a proportion of the light-shielding structure 231 covered by the color film unit 24 becomes smaller, a proportion of the light-shielding structure 231 that is in direct contact and overlaps with the planarization layer 26 becomes larger. Consequently, the reflectivity of the second sub-display area AA2 becomes larger. When it amounts for 40%, the reflectivity of the second sub-display area AA2 is 5.9%. In the third sub-display area AA3, the entire light-shielding structure is covered by the color film units 24, and thus the proportion of the light-shielding structure 231 that is in direct contact and overlaps with the planarization layer 26 is 0. In this case, the reflectivity of the third sub-display area AA3 is 5.9%. It can be seen from Table 2 that with the embodiments of the present disclosure, the reflectivity of the second sub-display area AA2 may be effectively improved, and the reflectivity of the second sub-display area AA2 and the reflectivity of the third sub-display area AA3 meet the same condition.

In addition, in order to adjust the same color coordinates for both the third sub-display area AA3 and the second sub-display area AA2 in Table 2 to meet the same condition, that is, the color coordinates a for both the third sub-display area AA3 and the second sub-display area AA2 meet the same condition, and the color coordinates b for both the third sub-display area AA3 and the second sub-display area AA2 meet the same condition, the first coverage area may be set to be smaller than the second coverage area, and/or the first difference may be set to be different from the second difference, as in the implementation described in the above embodiment.

Referring to FIG. 10, FIG. 10 is a cross-sectional view of a display panel according to an embodiment of the present disclosure. The left portion of FIG. 10 is a cross-sectional view of the third sub-display area AA3 of the display panel, and the right portion of FIG. 10 is a cross-sectional view of the sub-display area AA2. As shown in FIG. 10, a through hole 27 is arranged in the second sub-display area AA2 to penetrate through the light-shielding structure 231. The reflectivity of the second sub-display area AA2 may be increased by providing the through hole 27, and the appearance of the second sub-display area AA2 and the appearance of the third sub-display area AA3 in a black-screen state meet the same condition.

In one embodiment, the common cathode 222 and a thin film encapsulation layer 28 are arranged sequentially on a side of the pixel definition layer 25 away from the substrate 21. By providing the through hole 27, the ambient light may be reflected by the common cathode 222 and then emitted out through the through hole 27. The common cathode 222 has a higher reflectivity than the light-shielding structure 231 serving as a non-metallic layer. Therefore, the reflectivity of the second sub-display area AA2 may be increased by providing the through hole 27, and thus a difference in the reflectivity between the second sub-display area AA2 and the sub-display area AA3 is reduced.

In the implementation shown in FIG. 10, the through hole 27 does not overlap with the color film unit 24 in a direction perpendicular to the display panel. The through hole 27 does not overlap with the sub-pixel 22 in a direction perpendicular to the display panel, and thus the light emission and image display of the sub-pixel 22 is not affected. In the third sub-display area AA3, areas of the light-shielding layer 23 other than the first opening K1 are not hollowed, that is, no through hole is arranged in areas other than the first opening K1.

In the implementation shown in FIG. 10, an orthographic projection area of the through hole 27 on the substrate is 20 $\mu m^2$ to 50 $\mu m^2$. It is shown through a simulation experiment that in a case that the through hole 27 does not overlap with the color film unit 24, the orthographic projection area of the through hole 27 on the substrate is set to be 20 $\mu m^2$ to 500 $\mu m^2$ to effectively improve the reflectivity of the second sub-display area AA2. In the implementation, since the through hole 27 is not blocked by the color film unit 24, the reflectivity of the second sub-display area AA2 may be effectively improved through the through hole 27. The area of the through hole area 27 is relatively small.

In the implementation shown in FIG. 10, the through hole 27 is arranged in the light-shielding structure 231 in the second sub-display area AA2, while no through-hole 27 is arranged in the light-shielding structure 231 in the third sub-display area AA3. Since the reflectivity of the light shielding structure 231 provided with the through hole 27 is higher than that of the light shielding structure 231 provided with no through hole 27, the reflectivity of the second sub-display area AA2 may be increased.

Referring to FIG. 11, FIG. 11 is a cross-sectional view of the display panel according to another embodiment of the present disclosure. The left portion of FIG. 11 is a cross-sectional view of the third sub-display area AA3 of the display panel, and the right portion of FIG. 11 is a cross-sectional view of the second sub-display area AA2. Different from the implementation shown in FIG. 10, the through hole 27 overlaps with the color film unit 24 in the direction perpendicular to the display panel as shown in FIG. 11. That is to say, the color film unit 24 is arranged to cover the through hole 27 in the direction perpendicular to the display panel, that is, the color film unit 24 is arranged to fill the through hole 27.

In the implementation shown in FIG. 11, the orthographic projection area of the through hole 27 on the substrate is 400 μm² to 600 μm². It is shown through a simulation experiment that in a case that the through hole 27 overlap with the color film unit 24, the orthographic projection area of the through hole 27 on the substrate is set to be 400 μm² to 600 μm² to effectively improve the reflectivity of the second sub-display area AA2. Since the through hole 27 is blocked by the color film unit 24, the reflectivity could be somewhat affected. To this end, the area of the through hole 27 is relatively large in the implementation shown in FIG. 11, as compared with the implementation shown in FIG. 10.

In the implementations shown FIG. 10 and FIG. 11, the through hole 27 may be a round hole, a square hole, or a triangular hole. In another implementation, the through hole 27 may also be in a ring structure or a block structure surrounding the first opening K1. In a case that the through hole 27 is filled with the color film unit 24, the thickness of the color film unit 24 located in the through hole 27 may be reduced in order to further improve the reflectivity of the through hole 27. A distance from the first opening K1 to the pixel opening P in the second sub-display area AA2 is larger than a distance from the first opening K1 to the pixel opening P in the third sub-display area AA3, to facilitate the arrangement of the through hole 27 in the second sub-display area AA2, and/or a larger area of the light-shielding structure 231 may be exposed through the color film unit 24.

Referring to FIG. 12, FIG. 12 is a cross-sectional view of the display panel according to still another embodiment of the present disclosure. As shown in FIG. 12, in the second sub-display area AA2, the color film units 24 in at least some first openings K1 each include a second opening K2. In the second sub-display area AA2, the color film units 24 in at least some first openings K1 are arranged to each include the second opening K2, to further increase the reflectivity of the second sub-display area AA2.

It should be noted that, the thickness of the color film unit 24 may be reduced in the second sub-display area AA2 as compared with the third sub-display area AA3, and/or the second opening K2 is arranged in the color film unit 24 in the second sub-display area AA2, to further increase the reflectivity of the second sub-display area AA2.

Referring to FIG. 13, FIG. 13 is a top view of the sub-pixel and the first opening and color film unit corresponding to the sub-pixel in the second sub-display area. As shown in FIG. 13, for the sub-pixel 22 that emits the light of any color and first opening K1 and the color film unit 24 corresponding to the sub-pixel 22, in the second sub-display area AA2, the color film unit 24 is projected on the substrate 21 with a first vertical projection, the first opening K1 is projected on the substrate 21 with a second vertical projection, and the sub-pixel 22 is projected on the substrate 21 with a third vertical projection. The first vertical projection, the second vertical projection and the third vertical projection are all in a form of a similar geometry. The first vertical projection, the second vertical projection and the third vertical projection have their centers coincide with one another, and their areas decrease sequentially.

For the sub-pixel 22 that emits the light of any color and first opening K1 and the color film unit 24 corresponding to the sub-pixel 22, the first vertical projection is arranged to be greater than the second vertical projection, and the entire first opening K1 is covered by the color film unit 24, with the boundary of the color film unit 24 extending beyond the boundary of the first opening K1. In this way, the entire first opening K1 is covered by the color film unit 24, to ensure a filtering effect of the color film unit 24 on the sub-pixel 22. The second vertical projection is arranged to be greater than the third vertical projection, so as to prevent the first opening K1 from blocking the light emitted by the sub-pixel 22 to ensure the luminance of the emitted light.

In one embodiment, in the implementation shown in FIG. 13, the first vertical projection, the second vertical projection and the third vertical projection are all in a circular shape.

Multiple pixel units that are periodically arranged on the display panel. Each pixel unit includes multiple sub-pixels 22. The arrangement of the sub-pixels 22 in the pixel unit may be set as needed. In Table 3 below, an example in which the pixel unit includes two green sub-pixels, one blue sub-pixel and one red sub-pixel is described below. The four sub-pixels are arranged in 2×2 array, with two green sub-pixels arranged at the diagonal positions of the 2×2 array. It can be seen from Table 3 that the arrangement of the through hole 27 in the second sub-display area AA2 effectively improves the reflectivity of the second sub-display area AA2.

The increase in the reflectivity of the second sub-display area AA2 depends on the area of the through hole 27 in the light-shielding structure 231. The larger the area of the through hole 27 is, the more the reflectivity of the second sub-display area AA2 is increased. As shown in Table 3, if an aperture ratio of the through holes 27 in the light shielding structure 231 is 1.5% (i.e., the orthographic projection area of the through holes 27 on the substrate is 36 μm²), the purpose of increasing the reflectivity may be met. As shown in Table 3, if the through hole 27 is filled with the color film unit 24, the reflectivity of the through hole 27 is affected. Therefore, the area of through hole 27 needs to be increased to meet the requirement of increasing the reflectivity of the second sub-display area AA2.

Reference is made to Table 3.

| | Second sub-display area | | | Third sub-display area |
|---|---|---|---|---|
| An area of through hole | 0 (no through hole in the shading structure) | 36 μm² | 500 μm² | 0 (no through hole in the shading structure) |
| Reflectivity | 5.5% | 5.9% | 5.91% | 5.9% |
| a | 0.17 | 1.1 | −1.42 | −0.22 |
| b | 0.28 | 0.07 | 0.05 | 0 |
| | | One through hole in one pixel unit | Through hole is filled with color film unit | |

Referring to FIG. 14, FIG. 14 is another top view of the sub-pixel and the first opening and color film unit corresponding to the sub-pixel in the second sub-display area. Different from FIG. 13, the first vertical projection, the second vertical projection and the third vertical projection are all in a rectangular shape in the implementation shown in FIG. 14.

In a display panel, first openings K1, corresponding to sub-pixels 22 that emit same color of light, are in a same size and shape, which will incur interference fringes. In the embodiment of the present disclosure, at least two of the first openings K1 corresponding to sub-pixels 22 that emit light of the same color have different shapes and/or sizes, so as to solve the problem of interference fringes.

The area of the third sub-display area AA3 accounts for a largest proportion of the entire display panel, and thus it is convenient to change both the shape and size of the first opening K1. Therefore, in the third sub-display area AA3, at least two of the first openings K1 corresponding to sub-pixels 22 that emit light of the same color have different shapes and/or sizes in order to better eliminate the interference fringe.

The first sub-display area AA1 has a larger area than the second sub-display area AA2, and thus it is convenient to change the shape of the first opening K1 in first sub-display area AA1. Accordingly, in the first sub-display area AA1, at least two of the first openings K1 corresponding to sub-pixels 22 that emit light of the same color have different shapes. The area of the second sub-display area AA2 is relatively small, and thus it is convenient to change the size of the first opening K1 in the second sub-display area AA2. Accordingly, in the second sub-display area AA2, at least two of the first openings K1 corresponding to sub-pixels 22 that emit light of the same color have different sizes, so as to reduce the manufacturing cost.

Based on the above embodiments, a display device is further provided according to another embodiment of the present disclosure. The display device is shown in FIG. 15.

Referring to FIG. 15, FIG. 15 is a schematic view showing a structure of a display device according to an embodiment of the present disclosure. The display device includes a display panel 41 described in any one of the above embodiments, and a sensing element 42. The sensing element 42 is arranged on a side of the display panel away from a display surface, and opposite to the first sub-display area of the display panel.

In the embodiments of the present disclosure, the display device may be an electronic device with a display function, such as a mobile phone, a tablet computer. The display device is provided with the display panel 41 according to the above embodiments. In this way, a difference in appearance in a black-screen state between the second sub-display area and the third sub-display area may be reduced.

The above embodiments are described in a progressive, or juxtaposed, or a combination of progressive and juxtaposed manner. Each of the embodiments is mainly focused on describing its differences from other embodiments, and reference may be made among these embodiments with respect to the same or similar parts. Since the devices disclosed in the embodiment corresponds to the method disclosed in the embodiment, the description for the device is simple, and reference may be made to the method in the embodiment for the relevant parts.

It should be noted that, in the description of the present disclosure, it should be understood that the drawings and the description of the embodiments are illustrative rather than restrictive. The same reference numerals are used to identify the same structures throughout the embodiments of the present specification. Additionally, the thickness of a layer, a film, a panel, an area may be enlarged in the drawings for ease of understanding and description. It may be understood that, when an element such as a layer, a film, an area or a substrate is referred to as being "on" another element, the element may be directly on another element or an intermediate element may exist between the element and the anther element. In addition, the term "on" indicates to position an element on or below another element, and does not essentially indicate to position an element on top of another element in a direction of gravity.

The orientation or positional relationship indicated by the terms "upper", "lower", "top", "bottom", "inner", and "outer" etc., is based on the orientation or positional relationship shown in the drawings, and is merely for the convenience of describing the present disclosure or simplifying the description, and does not indicate or imply that the device or element referred to must have a specific orientation or be constructed or operated in a specific orientation, and therefore cannot be understood as a limitation of the present disclosure. If a component is considered to be "connected" to another component, the component may be directly connected to another component or there may be a component arranged between the two components.

It should be further illustrated that a relation term such as "first" and "second" herein is only used to distinguish one entity or operation from another entity or operation, and does not necessarily require or imply that there is an actual relation or sequence between these entities or operations. Furthermore, terms such as "include", "comprise" or any other variations thereof are intended to be non-exclusive. Therefore, an article or device including a series of elements includes not only the elements but also other elements that are not enumerated, or further includes the elements inherent for the article or device. Unless expressively limited, the statement "including a . . . " does not exclude the case that other similar elements may exist in the article or the device other than enumerated elements.

What is claimed is:

1. A display panel, wherein a display area of the display panel comprises a first sub-display area, a second sub-display area surrounding at least a part of the first sub-display area, and a third sub-display area surrounding at least a part of the second sub-display area; a side of the first sub-display area away from a display surface is configured to carry a sensing element for sensing light;

the display panel comprises:

a substrate;

a plurality of sub-pixels, arranged in the display area on a side of the substrate;

a light-shielding layer arranged on a side of the sub-pixels away from the substrate, wherein the light-shielding layer comprises a light-shielding structure and first openings, and the first openings are in one-to-one correspondence with the sub-pixels; and color film units, arranged corresponding to the first openings, wherein each color film unit is located at a corresponding one of the first openings, and at least a part of the color film unit is arranged to cover the light-shielding structure;

wherein:

a proportion of the light-shielding structure covered with the color film units in the second sub-display area is smaller than a proportion of the light-shielding structure covered with the color film units in the third sub-display area; and/or, a thickness of the color film units in the second sub-display area is smaller than a thickness of the color film units in the third sub-display area.

2. The display panel according to claim 1, wherein a density of the sub-pixels in the second sub-display area is the same as a density of the sub-pixels in the third sub-display area; for sub-pixels emitting light of same color, the sub-pixel in the second sub-display area is smaller than that in the third sub-display area;

wherein within the unit area, the area of the light-shielding structure in the second sub-display area is larger than the area of the light-shielding structure in the third sub-display area.

3. The display panel according to claim 1, wherein in the second sub-display area, between two of the first openings that are adjacent to each other, at least a part of the light shielding structure does not overlap with the color film unit in a direction perpendicular to the display panel.

4. The display panel according to claim 1, wherein in the third sub-display area, the color film unit is arranged to entirely cover the light-shielding structure between two adjacent first openings in a direction perpendicular to the display panel.

5. The display panel according to claim 1, further comprising a first sub-pixel that emits light of a first primary color;

the color film units comprise a first color film unit facing the first sub-pixel;

within the unit area, the first color film unit arranged in the second sub-display area covers the light-shielding structure with a first coverage area, and the first color film unit arranged in the third sub-display area covers the light-shielding structure with a second coverage area, and the first coverage area is smaller than the second coverage area.

6. The display panel according to claim 1, wherein the display panel comprises a first sub-pixel and a second sub-pixel each emitting light of a different color; the color film units comprise a first color film unit facing the first sub-pixel and a second color film unit facing the second sub-pixel;

in the second sub-display area, within the unit area, a first difference exists between a coverage of the first color film unit on the light-shielding structure and a coverage of the second color film unit on the light-shielding structure;

in the third sub-display area, within the unit area, a second difference exists between a coverage of the first color film unit on the light-shielding structure and a coverage of the second color film unit on the light-shielding structure;

wherein the first difference is not equal to the second difference.

7. The display panel according to claim 1, wherein the display panel comprises a first sub-pixel and a second sub-pixel each emitting light of a different color; the color film units comprise a first color film unit facing the first sub-pixel and a second color film unit facing the second sub-pixel;

in the third sub-display area, within the unit area, a coverage of the first color film unit on the light-shielding structure is larger than a coverage of the second color film unit on the light-shielding structure;

wherein the first sub-pixel is a sub-pixel that emits red light.

8. The display panel according to claim 1, wherein the display panel comprises a first sub-pixel and a second sub-pixel each emitting light of a different color; and the color film units comprise a first color film unit facing the first sub-pixel and a second color film unit facing the second sub-pixel;

in the second sub-display area, within the unit area, a coverage of the first color film unit on the light-shielding structure is larger than a coverage of the second color film unit on the light-shielding structure;

wherein the second sub-pixel is a sub-pixel that emits green light.

9. The display panel according to claim 3, wherein in the second sub-display area, a width of a portion where the color film unit covers the light-shielding structure is 2 μm to 6 μm in a direction parallel to a plane of the light-shielding layer;

wherein the width is a distance from an edge of a portion of the color film unit that extends beyond the first opening where the color film unit is located.

10. The display panel according to claim 1, wherein a through hole is arranged in the second sub-display area to penetrate through the light-shielding structure.

11. The display panel according to claim 10, wherein the through hole does not overlap with the color film unit in a direction perpendicular to the display panel.

12. The display panel according to claim 11, wherein an orthographic projection area of the through hole on the substrate is $20 \ \mu m^2$ to $50 \ \mu m^2$.

13. The display panel according to claim 10, wherein the color film unit is arranged to cover the through hole in a direction perpendicular to the display panel, and the color film unit is arranged to fill the through hole.

14. The display panel according to claim 13, wherein an orthographic projection area of the through hole on the substrate is $400 \ \mu m^2$ to $600 \ \mu m^2$.

15. The display panel according to claim 1, wherein for the sub-pixel that emits light of any color and the first opening and the color film unit corresponding to the sub-pixel, in the second sub-display area, the color film unit is projected on the substrate with a first vertical projection, the first opening is projected on the substrate with a second vertical projection, and the sub-pixel is projected on the substrate with a third vertical projection;

the first vertical projection, the second vertical projection and the third vertical projection are all in a form of a similar geometry; the first vertical projection, the second vertical projection and the third vertical projection have their centers coincide with one another, and their areas decrease sequentially.

16. The display panel according to claim 1, wherein in the second sub-display area, the color film units in at least some first openings each comprise a second opening.

17. The display panel according to claim 1, wherein at least two of the first openings corresponding to the sub-pixels out of the sub-pixels that emit light of the same color have different shapes and/or sizes.

18. The display panel according to claim 17, wherein in the first sub-display area, the at least two of the first openings corresponding to the sub-pixels out of the sub-pixels that emit light of the same color have different shapes.

19. The display panel according to claim 17, wherein in the second sub-display area, at least two of the first openings corresponding to the sub-pixels out of the sub-pixels that emit light of the same color have different sizes.

20. A display device, comprising:
a display panel; and
a sensing element for sensing light,
wherein:
a display area of the display panel comprises a first sub-display area, a second sub-display area surrounding at least a part of the first sub-display area, and a third sub-display area surrounding at least a part of the second sub-display area;
the display panel comprises:
a substrate;
a plurality of sub-pixels, arranged in the display area on a side of the substrate;

a light-shielding layer arranged on a side of the sub-pixels away from the substrate, wherein the light-shielding layer comprises a light-shielding structure and first openings, and the first openings are in one-to-one correspondence with the sub-pixels; and color film units, arranged corresponding to the first openings, wherein each color film unit is located at a corresponding one of the first openings, and at least a part of the color film unit is arranged to cover the light-shielding structure;

wherein:

a proportion of the light-shielding structure covered with the color film units in the second sub-display area is smaller than a proportion of the light-shielding structure covered with the color film units in the third sub-display area; and/or, a thickness of the color film units in the second sub-display area is smaller than a thickness of the color film units in the third sub-display area;

wherein the sensing element is arranged on a side of the display panel away from a display surface and opposite to the first sub-display area of the display panel.

\* \* \* \* \*